United States Patent [19]
Crafts et al.

[11] Patent Number: 5,807,469
[45] Date of Patent: Sep. 15, 1998

[54] FLEXIBLE CONTINUOUS CATHODE CONTACT CIRCUIT FOR ELECTROLYTIC PLATING OF C4, TAB MICROBUMPS, AND ULTRA LARGE SCALE INTERCONNECTS

[75] Inventors: Douglas E. Crafts; Steven M. Swain, both of San Jose, Calif.; Kenji Takahashi; Hirofumi Ishida, both of Kanagawa, Japan

[73] Assignee: Intel Corporation, Santa Clara, Calif.

[21] Appl. No.: 534,489

[22] Filed: Sep. 27, 1995

[51] Int. Cl.[6] .................................................. C25D 17/04
[52] U.S. Cl. ................................. 204/297 W; 204/297 R
[58] Field of Search .......................... 204/297 R, 297 M, 204/297 W, 289, 286; 205/123

[56] References Cited

U.S. PATENT DOCUMENTS

| | | | |
|---|---|---|---|
| 4,500,394 | 2/1985 | Rizzo | 205/133 |
| 5,118,584 | 6/1992 | Evans et al. . | |
| 5,240,580 | 8/1993 | Henderson et al. . | |
| 5,256,274 | 10/1993 | Poris | 205/123 |
| 5,264,787 | 11/1993 | Woith et al. . | |
| 5,271,822 | 12/1993 | Nolan et al. . | |
| 5,282,944 | 2/1994 | Sanders et al. . | |
| 5,317,235 | 5/1994 | Treglio . | |
| 5,359,768 | 11/1994 | Haley . | |
| 5,369,545 | 11/1994 | Bhattacharyya et al. . | |
| 5,378,340 | 1/1995 | Van de Wynckel et al. . | |
| 5,406,210 | 4/1995 | Pedder . | |
| 5,409,593 | 4/1995 | Moskowitz . | |
| 5,413,646 | 5/1995 | Dash et al. . | |
| 5,413,692 | 5/1995 | Abys et al. . | |
| 5,418,425 | 5/1995 | Bachmor et al. . | |
| 5,426,345 | 6/1995 | Madsen . | |
| 5,427,674 | 6/1995 | Langenskiold et al. . | |
| 5,429,733 | 7/1995 | Ishida | 204/224 R |
| 5,436,062 | 7/1995 | Schmidt et al. . | |
| 5,516,416 | 5/1996 | Canaperi | 205/78 |

OTHER PUBLICATIONS

V. Murali, A. Bhansali, D. Crafts, I. Carpio, T. Rucker, and T. Workman, *C4—A High Performance Interconnect Technology for CPU Applications*, AITD, Intel Corporation, Santa Clara, California.

*Primary Examiner*—John Niebling
*Assistant Examiner*—Brendan Mee
*Attorney, Agent, or Firm*—Blakely, Sokoloff, Taylor & Zafman

[57] ABSTRACT

A cathode contact device is provided for providing particle deposition from an anode source onto a target surface of a working piece. The working piece has a first electrically conductive continuous contact surrounding the target surface. The cathode contact device includes a second electrically conductive continuous contact adapted for frictionally contacting the first contact along a continuous path located on the first contact. The second contact further has an inner periphery defining an aperture for passing therethrough the particles onto the target surface. Additionally, the cathode contact device includes a circuit for electrically coupling the second contact to an electrical current supply.

9 Claims, 8 Drawing Sheets

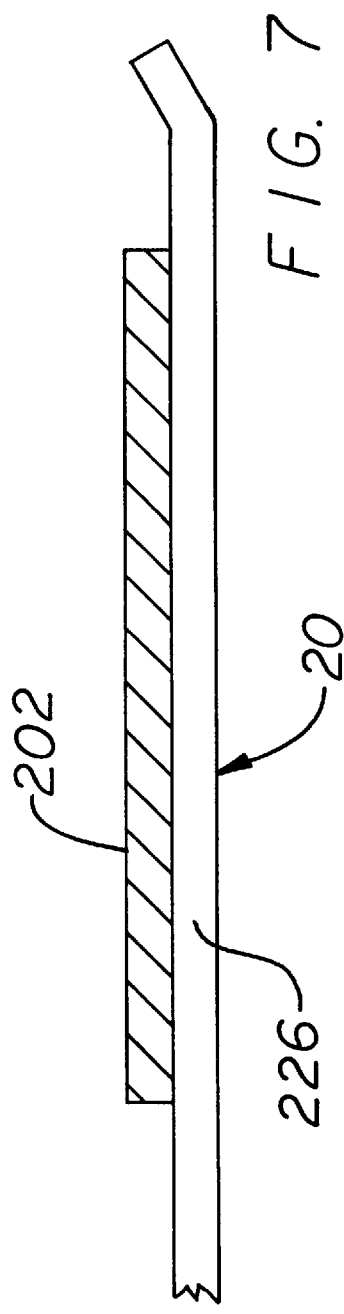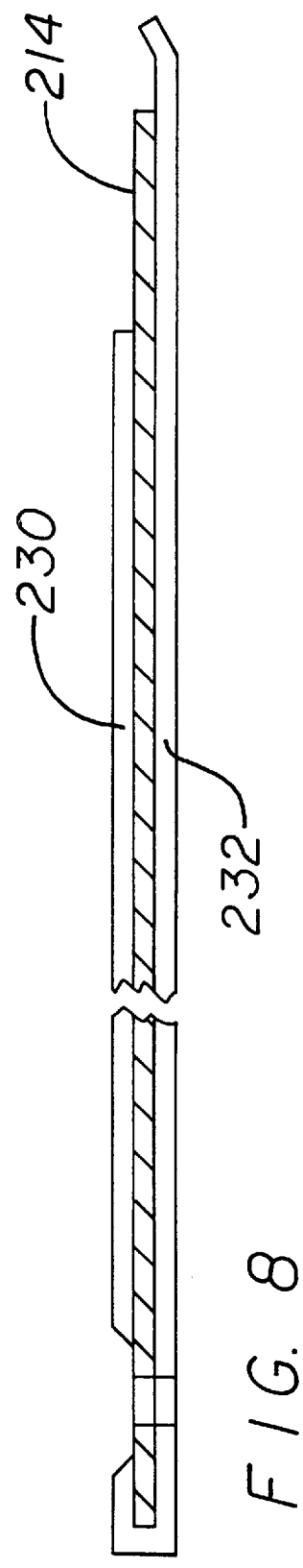

FLEXIBLE CONTINUOUS CATHODE CONTACT CIRCUIT FOR ELECTROLYTIC PLATING OF C4, TAB MICROBUMPS, AND ULTRA LARGE SCALE INTERCONNECTS

BACKGROUND OF THE INVENTION

1. Field of the Invention

This invention relates to the field of electroplating. More specifically, the present invention relates to an apparatus and a method for improving the process of electroplating of controlled collapse chip connection (C4) microbumps, of tape automated bonding (TAB) microbumps, and of integrated circuit interconnects.

2. Related Art

Typically, integrated circuits are assembled by using the standard "wirebond" integrated circuit method which will be explained in conjunction with FIGS. 1a–1d. FIG. 1a shows a wafer 10 with dice 12 laid out in horizontal and vertical rows. A die can be singled out, as shown in FIG. 1b, and bonded into a Pin Grid Array package (PGA) 14 shown in FIG. 1c. As one can see from this figure, first the die 12 is positioned face up within a recess 17 made onto the top surface 16 of the PGA 14. Then the die is bonded to the PGA 14 by means of the wirebond pads 18. The wirebond pads 18 are also connected to various functional blocks of the die via conductors (not shown). Typically, up to 600 wirebond pads are positioned around the periphery of the die for making connections with the package. A wirebonder is used to wirebond the die, via the wirebond pads 18 to the wirebond pads 19 positioned onto the top surface 16 of the PGA 14. The wires are looped up and over to the corresponding pads on the package as shown in FIG. 1d. One drawback of this method is that the routing of conductors, from the functional blocks of the die to the peripheral wirebond pads 18, increases signal propagation delays due to the high impedance of the conductors.

A more recent technology called controlled collapse chip connection ("C4") has emerged in the field of integrated circuit assembly. According to this method, the chip is positioned face down in the package, instead of face up. The die is then connected to the package via a plurality of solder bumps which are soldered to both the die and the package. The connections between the package and the die are made straight down into the package, as opposed to the connections in the conventional wirebond technology where the connections were made by routing conductors or wires to the peripheral wirebond pads, and then looping wires up and over to the package. Due to the shorter signal path from the die to the package, this method provides an improvement over the old method with respect to the parasitic impedances of the conductors.

According to one method for depositing solder bumps onto a wafer, a molybdenum mask 30 is overlaid onto the wafer 10 and then aligned to the input/output of each die 12 as shown in FIGS. 2a and 2b. The molybdenum mask has openings 32 at locations corresponding to the projected signal connections on the die. The wafer 10 and the overlaid mask 30 are inserted into a vacuum chamber and exposed to physical vapor deposition. A compound such as lead and tin, for example, is heated until it melts, evaporates inside the vacuum chamber, and deposits through openings 32 onto the wafer, thereby forming bumps. Once the compound is deposited, the molybdenum mask is torn off the wafer. The C4 bumps remain on the wafer at the desired locations corresponding to the respective openings in the mask thereby defining the desired microbump pattern in the molybdenum mask. The problem with this process is that a lot of the material is wasted during the deposition. Almost 90–98% of the material is deposited on the vacuum chamber's walls instead of being deposited onto the wafer.

A more advantageous method is electroplating solder onto the wafer. This method involves initially metalizing the surface of the wafer thereby forming a conductive layer across the wafer. The next step is depositing a photoresistive mask which defines a predetermined bump patterns, upon the surface of the conductive layer. The photoresistive material electrically insulates the metal layer except for the openings through the photoresist where bumps are to be plated. The following step is plating the bumps with an alloy of lead and tin. The bumps build up in a predetermined bump pattern, each bump having a desired final height. The next step is stripping the photoresistive material and also stripping the portions of the conductive layer which do not have bumps plated thereon so that the bumps will not be short-circuited.

The system used for the above-described electroplating process is configured utilizing a cup which contains the electrolyte and holds the wafer in place during the electroplating process. Electrolytic plating requires, among other things, an electrolyte which contains lead and tin in an ionic suspension, for example. Other metals however, depending on the specific application, can be used in the ionic suspension. Furthermore, electrolytic plating requires electrical contacts onto the wafer such that a negative charge will be distributed onto the conductive metal layer of the wafer. The negative charge flowing onto the wafer combines with positive ions from the electrolytic solution, through a reduction process, thereby causing the lead to be deposited onto the wafer in the form of microbumps positioned onto the wafer according to a predetermined microbump pattern. Typically, there are two types of currents which flow onto the wafer—cathode current and anode current. The cathode current is provided by the cathode along the surface of the wafer. The anode current, provided by the anode assembly, flows in a direction substantially transversal to the plane of the wafer towards the wafer to be plated.

The above-described method, however, suffers from several disadvantages. One such disadvantage is non-uniform cathode current flowing onto the cathode surface of the wafer. The non-uniform cathode current causes non-uniformity in the anode current which in turn causes the microbumps formed onto the wafer to display non-uniformity across the wafer. The nonuniform cathode current flowing onto the wafer is caused, mostly, by the fact that prior art cathode contacts were connected to the wafer at only a discrete number of points located at the periphery of the wafer.

Non-uniform bumps can cause several problems. For example, if the chip has bumps that are very small and bumps that are very large, the die will be tilted upon its assembly onto the package. The lack of uniformity in the bump pattern also causes open circuits due to the fact that not all microbumps are connected to the pads of the package. Yet another problem occurs where bumps are formed so close to each other causing a short circuit. This type of problem is also known as bridging bumps.

Furthermore, non-uniform distribution of negative charge onto the target surface can affect the deposition of metallic particles in cases other than microbumps electroplating. For example, integrated circuit interconnects are also plated onto silicon wafers. Non-uniformity of the cathode current can cause non-uniform thickness of the plated interconnect. This, in turn, can cause undesirable effects such as electromigration.

Furthermore, some electroplating methods require that the cathode contact, which is mounted on top of the cup, is easily removable once it is used up. However, removal of the cathode contact can be very difficult since the cathode contact will stick to the rim of the cup holding the cathode contact due to lead tin, or other metal, deposited between the cathode contact and the rim of the cup.

Consequently, a different type of configuration for the cathode contact is desirable such that the anode current flowing across the wafer will be uniformly distributed across the surface of the wafer. Moreover, it is desirable to have a cathode contact which is protected from particle deposition thereon. Furthermore, it is desirable to have a cathode contact which is easily removable once this contact needs to be replaced. Also, it is desirable to have a cathode contact which provides a resilient sealing against the photoresist layer of the wafer—thereby protecting, from deposition during plating, the exposed conductive metal contact located at the edge of the wafer. It is also desirable that the cathode contact be very thin in order to minimize the obstruction of smooth flow of the electrolyte at the periphery of the wafer. Also, it is desirable to have a cathode contact which is easily and precisely positioned onto the electroplating cup relative to a conductive contact of the wafer located at the periphery of the wafer.

BRIEF SUMMARY OF THE INVENTION

An apparatus and method are disclosed for overcoming the disadvantages and limitations associated with prior art cathode contact devices. Such disadvantages and limitations include, but are not limited to: non-uniform microbump or interconnect deposition created by discrete cathode contacts; undesired metallic deposition onto the surface of the cathode; and, difficulty in removing the cathode contact from the wafer once the cathode contact needs to be replaced.

The present invention provides a cathode device for providing particle deposition onto a target surface of a working piece. The particles to be deposited onto the target surface are driven by an electrical field created by the cathode device and an anode. The working piece generally has a first electrically conductive continuous contact surrounding the target surface of the working piece. The cathode device includes a second electrically conductive continuous contact adapted for frictionally contacting the first contact along a continuous path located on the first contact. The second contact further has an inner periphery defining an aperture for passing therethrough the particles onto the target surface of the working piece. Additionally, the cathode device is provided with a circuit for electrically coupling the second contact to an electrical current supply.

According to one embodiment of the present invention, it is provided a cathode contact device for electroplating microbumps or interconnects onto a substantially circular target surface of a semiconductor wafer, the semiconductor wafer having a first substantially annular electrically conductive contact surrounding the target surface, the microbumps or interconnects being formed by deposition of metallic ions onto the target surface at predetermined microbump or interconnect locations. The ions are driven by an electric field created by said cathode device and an anode upon coupling the cathode contact device and the anode to an electric current supply. The cathode contact device includes a second substantially annular electrically conductive continuous contact, substantially similar with the first contact. The second contact is adapted to frictionally engage the first contact along a continuous path located on the first contact. The second contact has a substantially circular inner periphery defining an aperture for passing the metallic ions onto the target surface. The site of the aperture is substantially identical with the circular target surface. The cathode contact device further has a circuit for supplying cathode current from the electric current supply to the second contact.

In another embodiment, a cathode contact device is provided for particle deposition onto a target surface of a working piece. The working piece has a first electrically conductive continuous contact surrounding the target surface. The cathode contact device comprises a flexible metal clad laminate having a flexible electrically conductive continuous contact adapted for frictionally contacting the first contact along a continuous path located on the first contact. The second contact further has an inner periphery defining an aperture for passing therethrough the particles onto the target surface. The cathode contact device further has a circuit for electrically coupling the second contact to a current supply.

The present invention also provides a method for providing uniform particle deposition from an anode source onto an electrically conductive target surface of a working piece. The method comprises the steps of (a) depositing by photolithography, a layer of photoresist onto the target surface, wherein selected areas of the target surface are covered by the photoresist, and non-selected areas of the target surface are not covered by the photoresist according to a predetermined particle deposition pattern; (b) removing, by etching, a portion of said photoresist located at the periphery of said layer of photoresist, thereby providing a first electrically conductive continuous contact around the target surface; (c) providing a source of particles; (d) providing a cathode contact device having a second electrically conductive continuous contact adapted for frictionally contacting the first contact along the continuous path located on the first contact, the second contact further having an inner periphery defining an aperture for passing therethrough the particles onto the target surface; (e) providing an anode for creating an electrical field between said anode and said cathode thereby driving said particles from said source of particles; (f) providing a circuit for electrically coupling the second contact to an electrical current supply; (g) mounting the cathode contact device onto the periphery of a working structure; (h) laying the working piece upon the cathode contact device whereby the first and second contacts are frictionally engaged around a continuous path located on the first contact; (i) coupling the second contact and the anode to an electrical current supply.

BRIEF DESCRIPTION OF THE DRAWINGS

The features, aspects, and advantages of the present invention will become more fully apparent from the following detailed description, appended claims, and accompanying drawings in which:

FIG. 1a–1d show different aspects of a conventional wirebond assembly of a die onto a package, in which FIG. 1a shows a wafer with a plurality of dies;

FIG. 1b shows a single die having a plurality of wire bond pads;

FIG. 1c shows a die and a PGA package before mounting the die on to the PGA package;

FIG. 1d shows a die mounted onto the PGA package.

FIG. 7 illustrates a cross-section of the annular portion of a laminated clad incorporating the cathode contact device according to the present invention.

FIG. 8 illustrates a longitudinal cross-section of an arm for connecting the cathode contact device to an electrical current supply.

DETAILED DESCRIPTION OF THE INVENTION

In the following description, numerous specific details are set forth to provide a thorough understanding of the present invention. However, one having ordinary skills in the art may be able to practice the invention without the specific details. In some instances, well-known circuits, structures and techniques have not been shown in detail not to unnecessarily obscure the present invention.

The present invention provides for a cathode contact device that generates a uniform current distribution over the entire surface of a wafer. In a preferred but non-limiting embodiment according to the present invention, the cathode contact is substantially continuous having a substantially annular surface surrounding the wafer. By using a continuous cathode contact, the negative charge current flowing onto the wafer can be uniformly distributed over the surface of the wafer causing in turn the anode current to be uniformly distributed across the surface of the wafer.

Figure 1A:
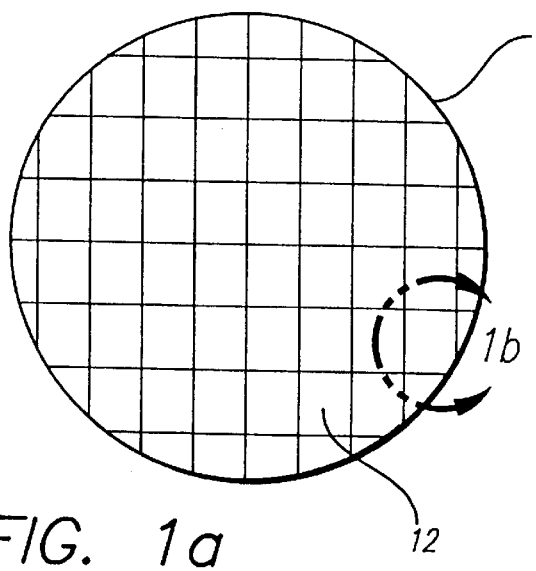
Figure 1B:
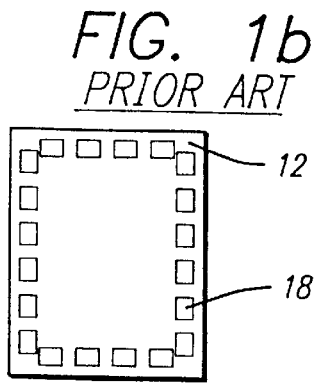
Figure 1C:
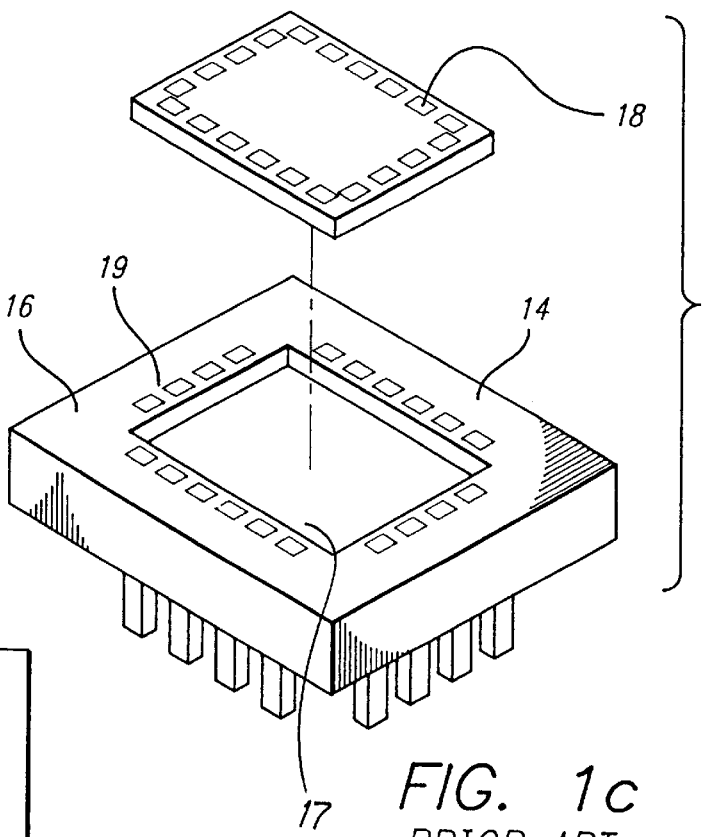
Figure 1D:
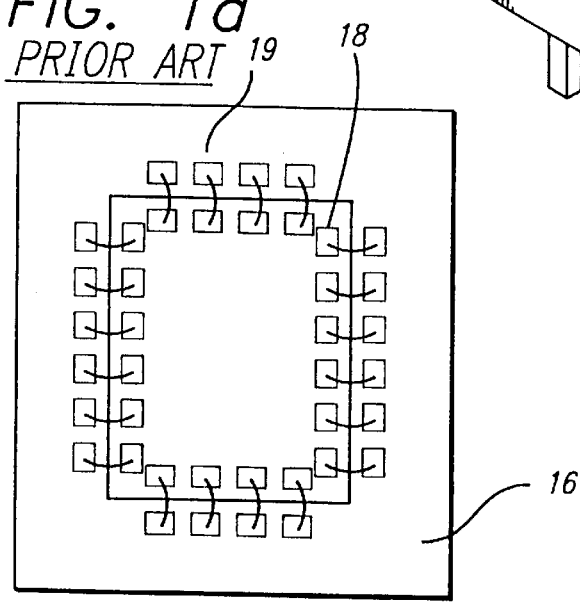
Figure 2A:
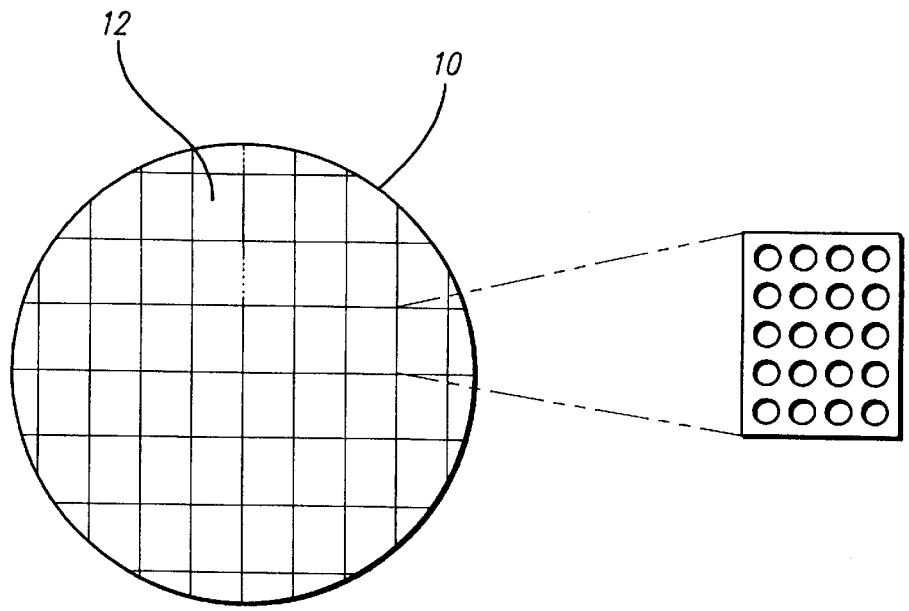
FIG. 2a and 2b illustrates a flip chip mask with a wafer according to the prior art C4 method.
Figure 2B:
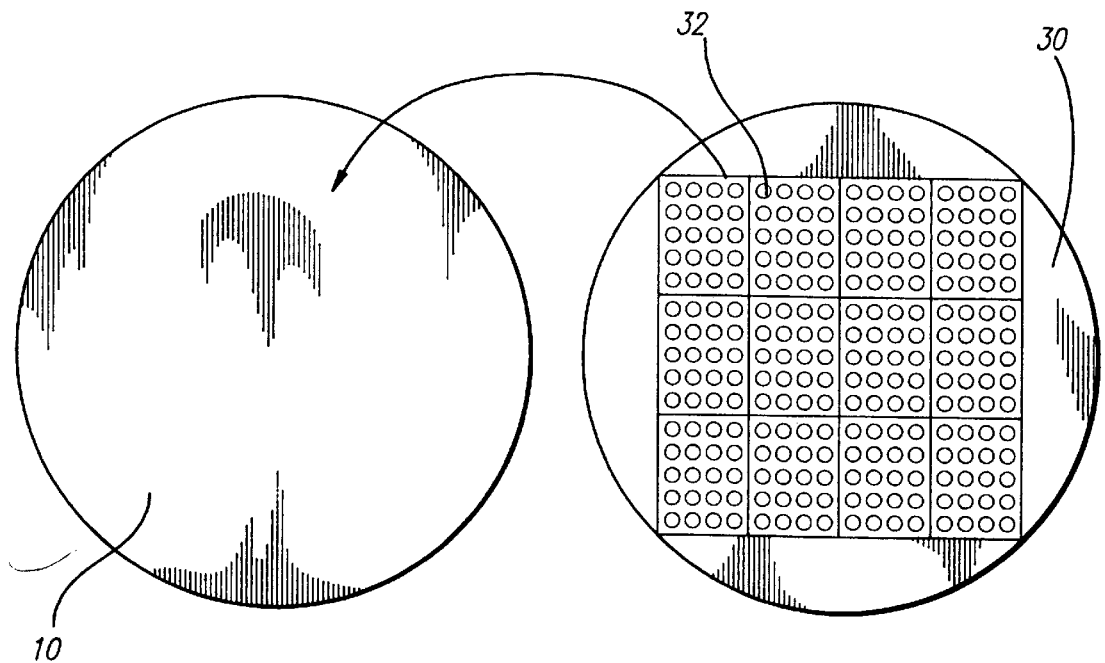
Figure 3:
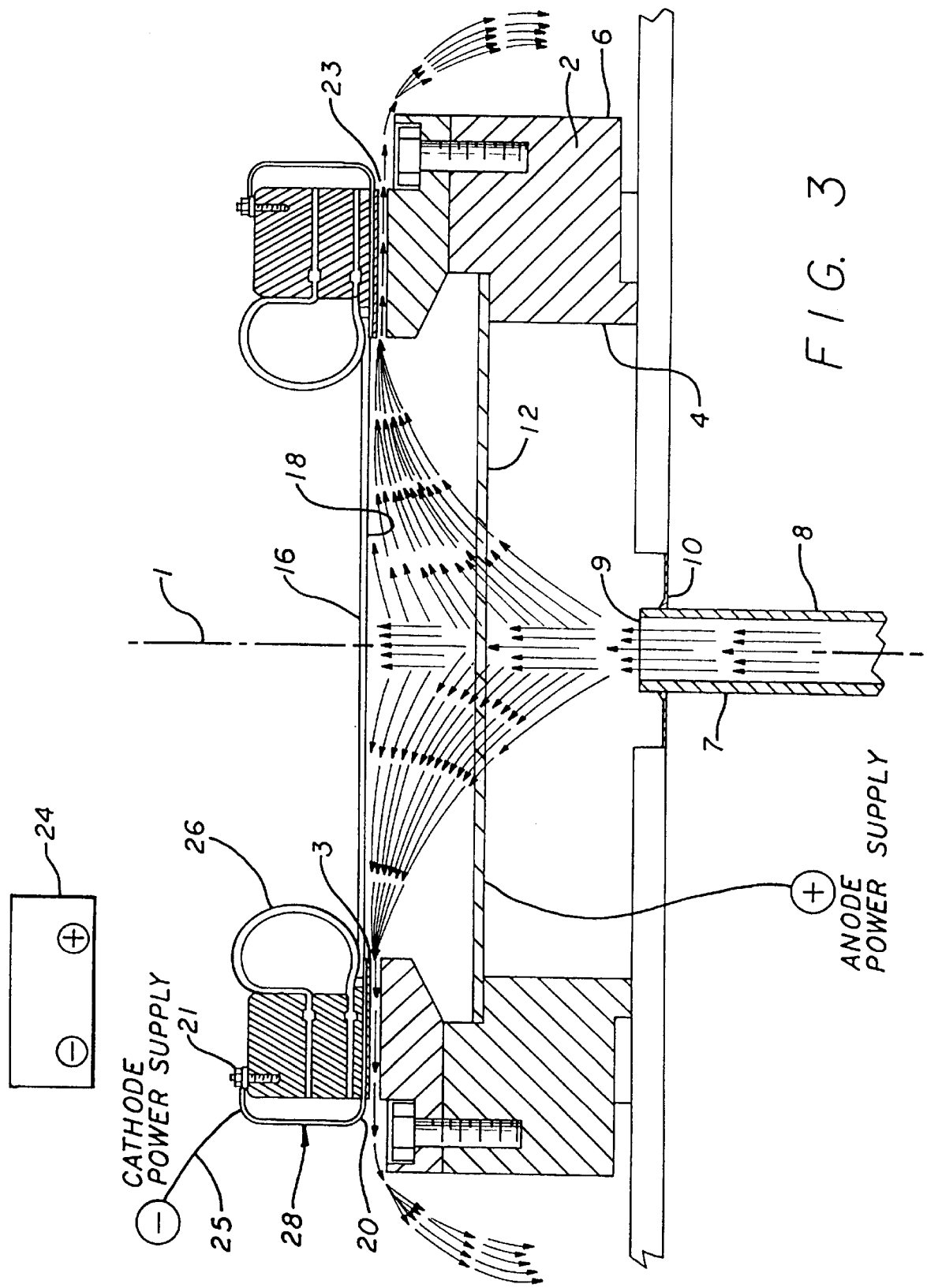
FIG. 3 illustrates an electroplating assembly with a cathode contact device mounted therein.

FIG. 3 shows a cross-sectional view taken across a longitudinal axis 1 of an electroplating assembly according to the present invention. The electroplating assembly according to the present invention includes a cup-shaped container 2 having an inner wall 4 defining an inner volume. The cup-shaped container 2 further has an outer wall 6. Mounted at a lower end of the container is a pipe 8 extending upwardly through the inner volume of the cup-shaped container. The upper part of pipe 8 is surrounded by a seal 10 located between the lower end part of the cup and the outer wall 7 of the pipe 8. The pipe 8 is inserted, at a lower end, into a vessel (not shown) having an electrolytic solution with metallic ions. The vessel further can be provided with a pump for pumping the metallic ions upwardly through pipe 8 and for expelling these ions via the opening 9, located at the upper end of tube 8, into the volume defined by the inner wall 4 of the cup.

The assembly shown in FIG. 3 is adapted to electroplate a target surface 18 of the working piece 16. Target surface 18 is the surface which needs to be electroplated for the purpose of generating microbumps or other conductive structures such as interconnects, for example, onto the wafer 16. In FIG. 3, target surface 18 is the surface of the wafer which is oriented downwardly, facing thus the flow of metallic ions. Furthermore, in this particular embodiment, working piece 16 has a substantially circular configuration.

However, the assembly, according to the present invention, is not limited to electroplating circular working pieces. Surfaces other than circular can be electroplated too.

The following discussion will refer to working piece 16 as a silicon wafer, although the scope of the present invention is not limited to silicon wafers. The silicon wafer 16 is mounted on top of a substantially annular cathode contact device 20 according to the present invention. The wafer 16 has an electrically conductive continuous contact (not shown) at the periphery of the target surface 18. This contact defines the contour of the substantially circular target surface. In this particular embodiment, the contact of the wafer is substantially annular. The cathode contact device 20 includes an electrically conductive continuous contact (not shown). The electrically conductive continuous contact of the cathode contact device 20, in this particular embodiment, is substantially annular. The continuous contact of cathode contact device 20 is adapted for frictionally contacting the electrically conductive continuous contact of the work piece 16 along a continuous path. The continuous path, along which the frictional engagement is provided, serves the purpose of creating a continuous electrical connection between the electrical current supply 24 and the conductive layer of silicon wafer 16, when the anode and cathode contact device illustrated in this figure are operatively connected to electrical current supply 24.

An anode 12 is positioned, within the inner electroplating cup wall 4, substantially transversely with respect to longitudinal axis 1. In operation, the cathode contact device 20 is connected to the negative pole of the current source 24 while the anode 12 is connected to the positive pole of current source 24.

The cup 2 also includes a substantially annular base 3. This base supports the cathode contact device 20. The cup 2 further has a gap 23 through which metallic ions that are not deposited onto the target surface 18 are evacuated.

Cathode contact device 20 additionally has at least an electrically conductive arm 28 outwardly extending from the electrically conductive contact of the cathode. In this particular embodiment electrically conductive arms 28 are made of a flexible material for the purpose of connecting the cathode device to the screws 21. From screws 21 electrically conductive wires 25 are connected to the electrical current supply 24. A balloon 26 is positioned at the upper part of the assembly for holding the wafer in place upon the inflation of this balloon.

Figure 4:
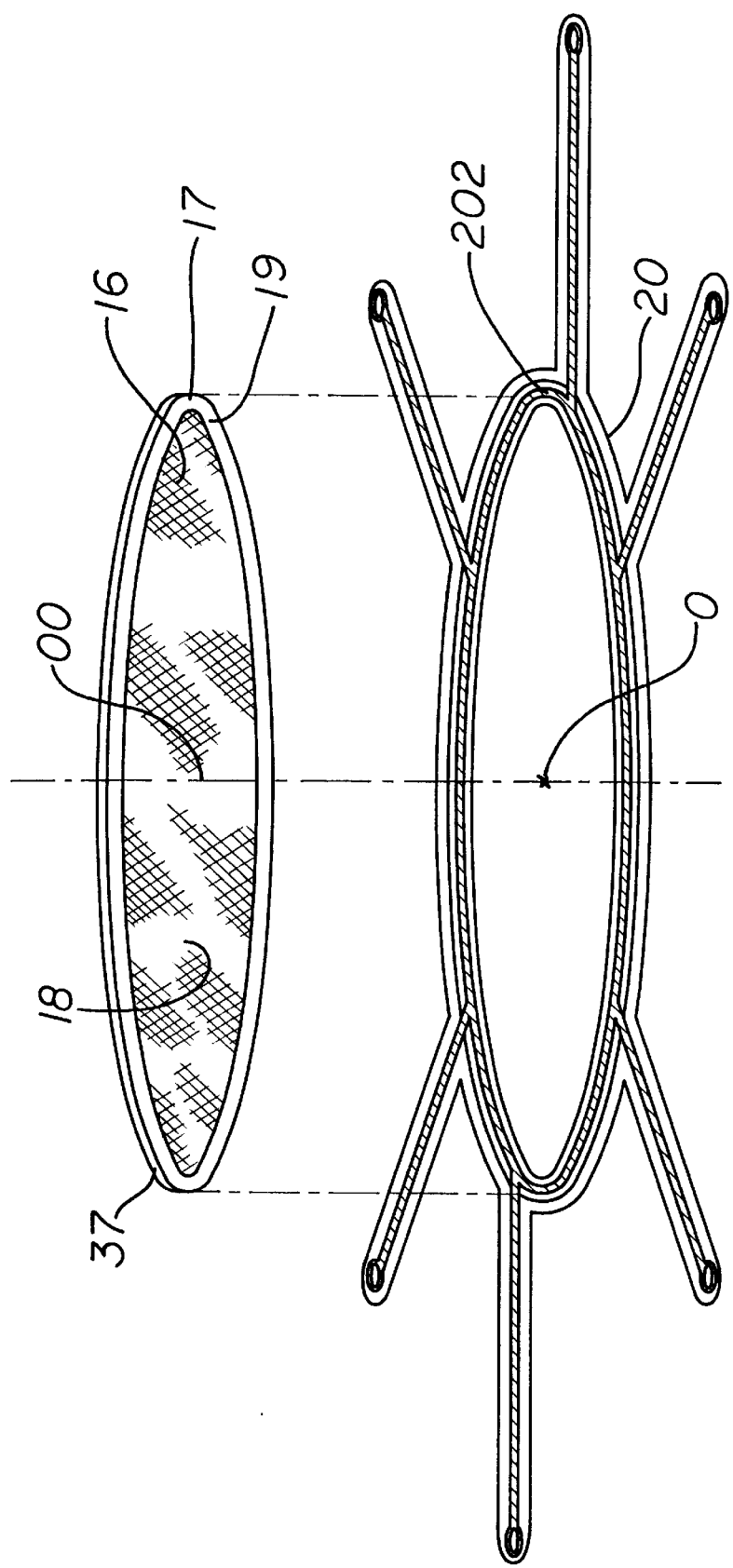
FIG. 4 illustrates a view of a wafer and the cathode contact device according to the present invention.

FIG. 4 shows a view of the wafer 16 and the cathode contact device, according to the present invention. According to this configuration when the center 0 of the cathode contact device 20 is concentrically aligned with the center 00 of the wafer 16, and the wafer 16 is frictionally superimposed over the cathode contact device 20, the electrically conductive continuous contact 202 can frictionally contact the top surface 19, of electrically conductive continuous contact 17 of the wafer, along a continuous path (not shown). Consequently, upon connecting the cathode device 20 and the anode (not shown) to an electrical current source, a substantially uniform flow of negative charge over target surface 18 of the wafer will result. Accordingly, a corresponding uniform electric field created between the anode and the cathode will act upon the metallic ions which will thus be uniformly distributed across the target surface 18. Therefore, a substantially uniform deposition of the desired metal onto a predetermined microbump pattern or interconnect pattern will result.

Figure 5:
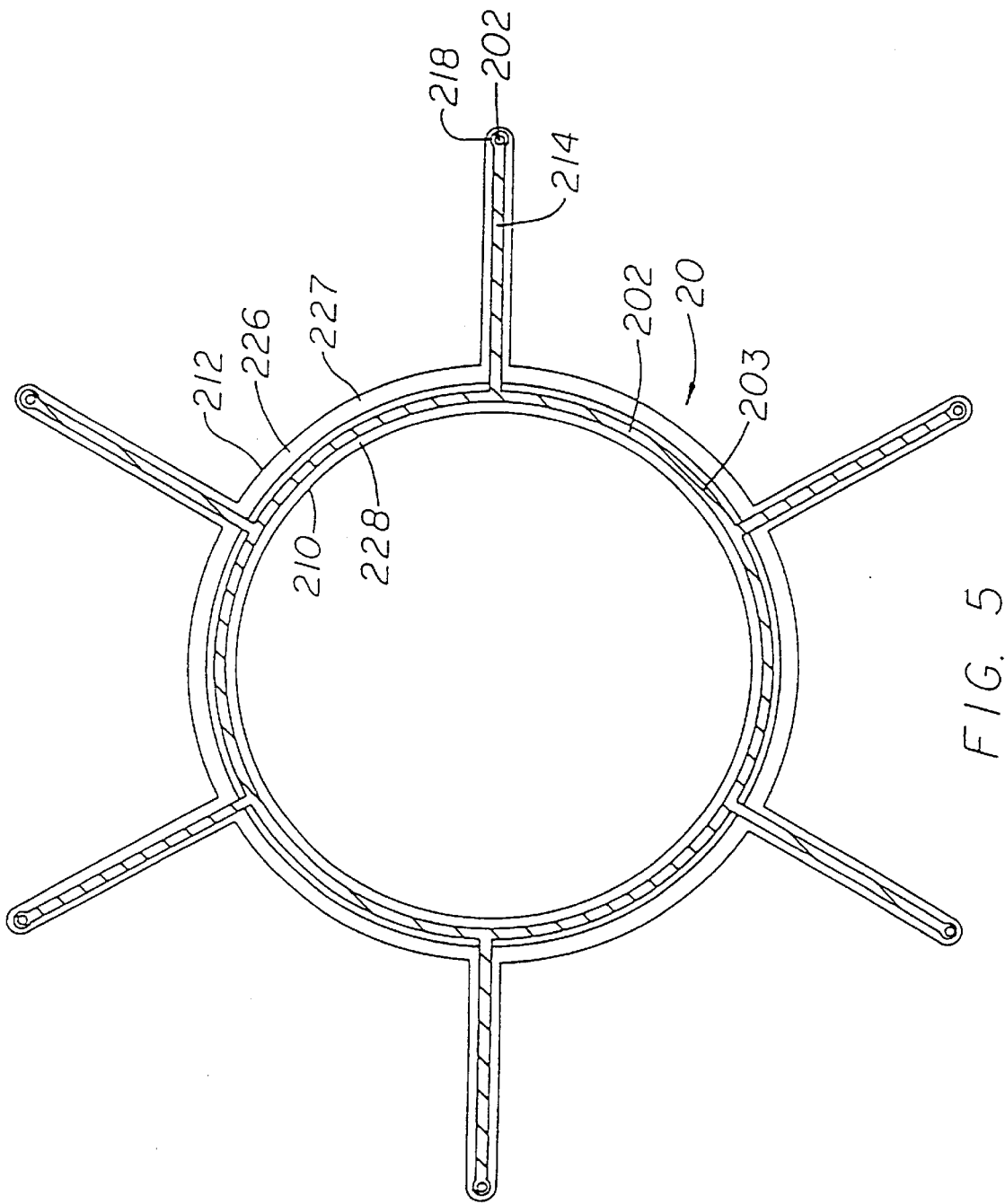
FIG. 5 illustrates a top view of the continuous cathode contact device according to the present invention.

FIG. 5 illustrates a top view of the continuous cathode device 20 according to the present invention. As one can see, the cathode device 20, in this particular embodiment, has a substantially annular shape. Cathode device 20 includes an electrically conductive continuous contact 202. Contact 202 has a top surface 203 adapted for frictionally contacting the continuous electrically conductive contact of target surface 18 of FIGS. 3 and 4.

The contact 202 has a shape and a size substantially identical with the electrically conductive continuous contact of the wafer. This is to ensure that upon mounting the wafer 16 on top of cathode contact device 20, contact 202 frictionally contacts the electrically conductive continuous contact of wafer 16 along a continuous path located on the electrically conductive continuous contact 17 of wafer 16. However, the shape and size of the electrically conductive contact 202 are not limited to the shape and the size of the electrically conductive continuous contact 17 of wafer 16. The contact 202 could have a different shape and/or size as long as its top surface 203 frictionally contacts the contact 17 of wafer 16 along a continuous path located on the continuous contact of the wafer, when the wafer and the cathode device 20 are aligned and contact each other. For example, the contact 202 could have a disk shape, as opposed to annular shape, equal or greater than the target surface of the wafer. In this case, the cathode device 20 could be positioned on top of wafer 16 as opposed to beneath wafer 16. Wafer 16, in this case, would have its electrically conductive continuous contact running along the back surface of the wafer.

In another embodiment, the electrically conductive continuous contact of wafer 16 could be positioned around the circular side 37 of wafer 16 shown in FIG. 4. In this case, the cathode contact device 20 could be adapted to continuously frictionally engage wafer 16 around the circular side 37. In this case, the desired continuous electrical contact of the cathode contact device with the electrically conductive contact of the wafer would be made around the circular side 37.

The cathode contact device 20 further has a circuit for coupling the electrically conductive body to the electrical current supply (not shown). In this particular embodiment, the circuit for coupling the electrically conductive contact 202 to the electrical current supply includes one or more arms 214 outwardly extending from contact 202. In this particular embodiment, arms 214 are made integrally with contact 202. Arms 214 have a free end 218 provided with an aperture 202 for connecting the cathode contact 202 to the electrical current supply.

Additionally, the cathode contact device 20 has a substantially circular inner periphery 210 and a substantially circular outer periphery 212. As one can see from this figure, the inner periphery 210 and the outer periphery 212 define the boundaries of cathode device 220. The inner periphery 210 defines the area of the target surface which will be electroplated. As such, the shape of the inner periphery is not limited circular, but it can have any other shape corresponding to the desired shape of the surface to be electroplated. Similarly, the outer periphery 212 is not limited to circular but can also have other shapes. For example, the shape of the outer periphery may be constrained by a recess placed onto the rim (top surface) of the cup upon which the cathode is mounted.

Figure 6:
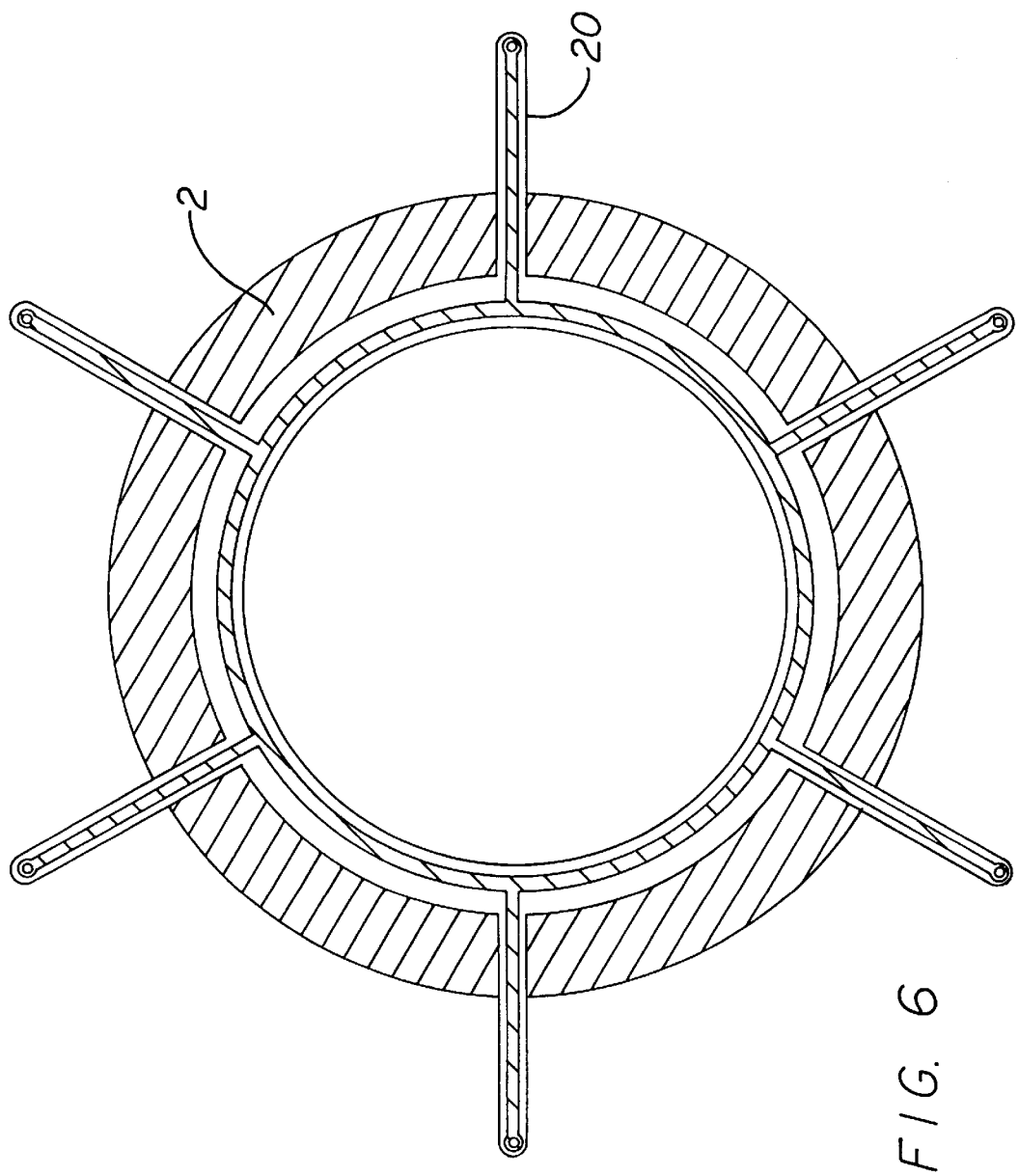
FIG. 6 shows a top view of the continuous contact device mounted into an electroplating cup.

FIG. 6 shows the cathode contact device 20 of the present invention overlaid on the top surface of cup 2. The continuous cathode contact device is held in place, in cup 2, by a recess machined in the top surface of the cup. This recess matches the inner and outer periphery of the cathode contact device such that the cathode contact device is held in a substantially fixed position with respect to the cup.

FIG. 7 shows a cross-section of the annular part of the cathode contact device 20 having annular dielectric layer 226 bonded to contact 202 thereby forming a clad laminate. When the cathode contact device is mounted on the top surface of cup 2, of the electroplating assembly illustrated in FIG. 6, the electrically conductive contact 202 will be shielded from ionic contact by dielectric surface 226 which prevents the deposition of metallic ions onto this contact. Generally, the dielectric layer 226 is laminated to the electrically conductive contact 202 by a process of photolithography.

The electrically conductive arms 214 can be equally clad into a laminate having two layers of dielectric 230 and 232 sealably enclosing arms 214 in between as shown in FIG. 8. In such way ion deposition onto the surface of the arms 214 is prevented equally.

Figure 9:
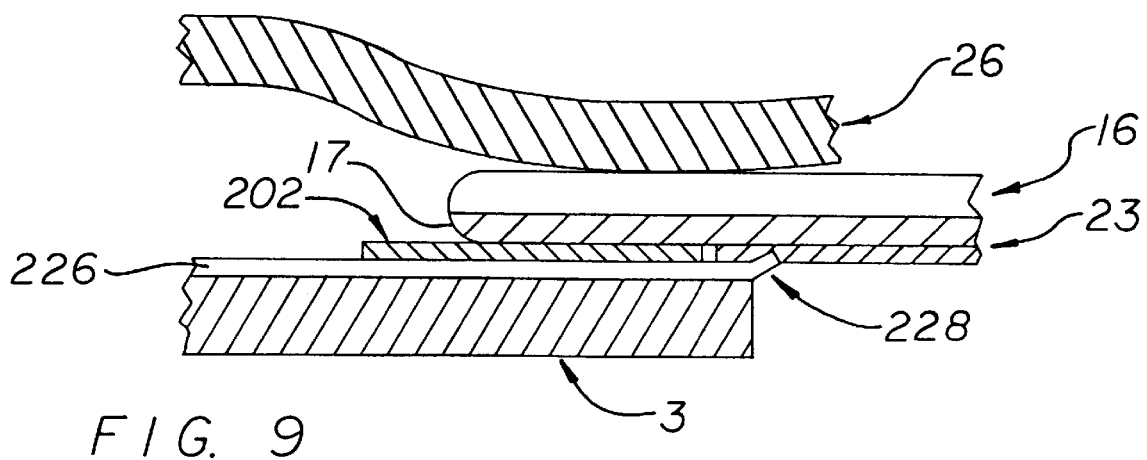
FIG. 9 illustrates a cross-sectional view of a cathode contact device mounted onto a wafer.

The dielectric layer 226 substantially prevents ionic deposition onto the continuous electrically conductive contact 202 of the wafer, as one can see in FIG. 9 which shows a cross-sectional view of the coupling between the cathode contact and the periphery of the wafer 16. This is achieved by sealing the internal portion 228, of the dielectric layer 226, against the periphery of the photoresist layer 23 coated onto the target surface. The dielectric layer can be made of polyamide or any other type of dielectric material which is resilient to compression against the photoresistive surface 23. FIG. 9 also shows the contact 202 frictionally engaged with the conductive contact 17 of the wafer thereby providing an electric path for the flow of negative electric charge from the current supply onto the target surface of the wafer.

The electrically conductive contact 202 and the dielectric layer 226 can be made of flexible materials bonded as a flexible laminate clad. This feature offers the capability of easily removing the cathode when such cathode is used up due to exposure to electrolyte acids and wear imposed by multiple wafer processing. Because the cathode contact device has to be fitted through small spaces and, consequently, at times it needs to bend, a flexible contact such as the contact according to the present invention overcomes this mounting problem. Similarly, flexible arms 214 o f the flexible cathode contact device according to the present invention can be slipped through narrow slots in the side of the cup, and then routed out to the power supply much like a wire. Accordingly, the cathode contact device can be easily replaced without incurring the time penalty that would otherwise be required to disassemble the entire electroplating assembly.

The flexible cathode contact device according to the present invention provides an additional advantage. As one can see in FIG. 3, a certain amount of metallic particles are evacuated through the gap 23 after being flown towards the target surface 18. It is desirable that the flow of metallic ions in the vicinity of the periphery of the wafer, close to the gaps 23, is not obstructed. An obstruction in the path of these particles could disturb the smooth flow of these particles, thereby causing turbulences which affect the deposition of metal at the periphery of the wafer. As one can see in FIG. 3, the base 3 forms, to a certain extent, an obstruction in the path of ions flowing out towards gap 23. The cathode contact device 20 inserted into the electroplating assembly additionally contributes to the obstruction of ions. It is thus desirable to have a cathode contact device with a very low thickness such that the obstruction posed by this cathode contact device is minimized. The cathode contact device, according to the present invention, substantially minimizes the effect of its obstruction in the path of metallic ions by having a low thickness. A combined thickness of the metal flexible layer and the insulating flexible layer is approximately 0.012 millimeters.

Figure 10:
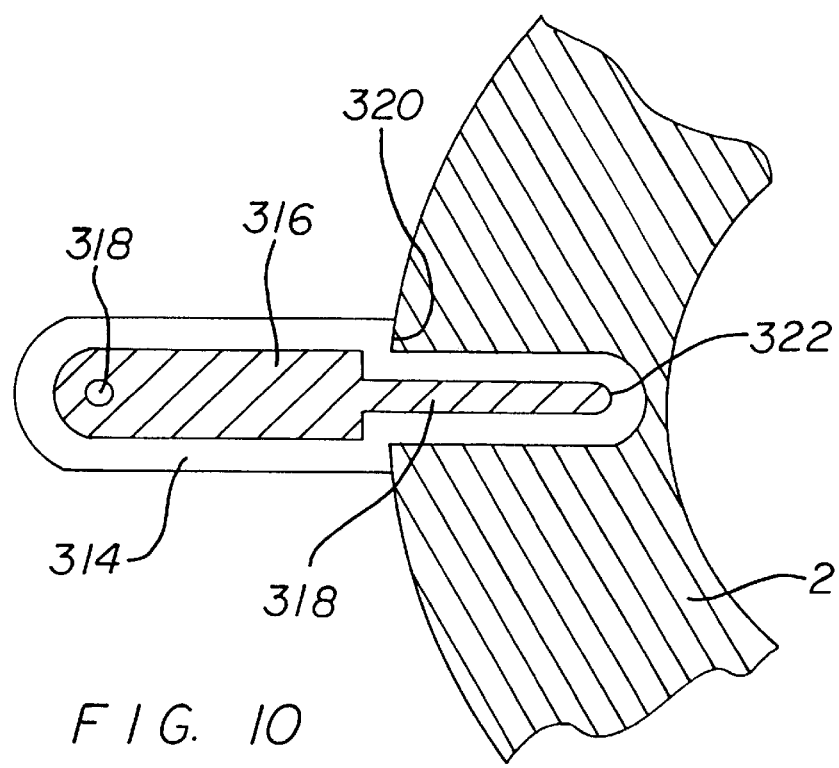
FIG. 10 illustrates an alternative embodiment of a discrete flexible cathode contact device according to the present invention.

FIG. 10 illustrates a different embodiment of the present invention wherein the cathode contact device includes a plurality of flexible tabs which connect the power supply to the electrically conductive contact of the wafer at a discrete number of points. For example certain types of electroplating applications such as gold electroplating require a lower cathode current. Very often in such applications, the target surface to be electroplated is relatively small with respect to the cathode contact. In this situation the cathode contact has to be precisely positioned with respect to the target surface. The present invention provides for a mechanism for installing the discrete cathode contact tabs onto discrete recesses positioned onto the top surface of the cup. As one can see in FIG. 10, tab 314 has a first portion 316 with an end 318 for coupling to an electrical current supply. Tab 314 has a second portion 318 integral with the first portion. The second portion has end 322, for frictionally contacting the electrical conductive contact of the target surface (not shown). The first portion has a width larger then the width of the second portion. The shoulder 320 is formed at the junction of those portions. This shoulder acts as a stopper. When the cathode contact device 20 is installed within the cup 2, illustrated in FIG. 10, the shoulder 320 rests against the outside periphery of the cup, thus, providing the means for positioning the contact precisely within the recess of the top surface of the cup.

In the foregoing specification, the invention has been described with reference to specific embodiments thereof. The specification and drawings are accordingly, to be regarded in an illustrative rather than a restrictive sense. It will however be evident that various modifications and changes can be made thereto without departing from the broader spirit and scope of the invention as set forth in the appended claims.

What is claimed is:

1. A cathode contact device for contacting a working piece having a first electrically conductive continuous contact that is substantially annular, said cathode device comprising:

a first flexible clad laminate having a flexible electrically conductive continuous contact adapted for frictionally contacting said first contact along a continuous path located on said first contact, said first flexible clad laminate further having an inner periphery defining an aperture said first flexible clad laminate having an insulating flexible layer bonded to said flexible electrically conductive continuous contact; and at least one electrically conductive arm integral with said second contact and extending from said second contact.

2. The device recited in claim 1 wherein said insulating layer comprises polyamide.

3. The device of claim 1 wherein said first contact and said flexible contact have substantially identical shapes.

4. The device of claim 3 wherein said first contact and said flexible contacts have substantially identical sizes.

5. The device recited in claim 4 wherein said insulating layer is substantially annular.

6. The device recited in claim 1 wherein said insulating flexible layer has a substantially annular resilient sealing surface extending radially inwardly from said second contact.

7. The device recited in claim 6 wherein said working piece has a target surface that is coated with a photoresistive layer.

8. The device recited in claim 7 wherein said sealing surface is adapted for annularly sealing said first contact of the working piece upon engagement of said sealing surface with a peripheral portion of said photoresistive layer.

9. The device recited in claim 1 wherein the combined thickness of said metal flexible layer and said insulating flexible layer is approximately 0.12 mm.

* * * * *

UNITED STATES PATENT AND TRADEMARK OFFICE
CERTIFICATE OF CORRECTION

PATENT NO. : 5,807,469
DATED : September 15, 1998
INVENTOR(S) : Crafts et al.

It is certified that error appears in the above-identified patent and that said Letters Patent is hereby corrected as shown below:

In column 5 at line 9, please begin a new paragraph beginning with the sentence -- FIG. 7 illustrates ... --.

In column 8 at line 44, please delete " o f " and insert -- of --.

In column 9 at line 4, please delete " 0.012 millimeters " and insert -- 0.12 millimeters --.

Signed and Sealed this

Twenty-third Day of March, 1999

Attest:

Q. TODD DICKINSON

Attesting Officer

Acting Commissioner of Patents and Trademarks